(12) United States Patent
Lifshin et al.

(10) Patent No.: US 9,754,360 B2
(45) Date of Patent: Sep. 5, 2017

(54) DETERMINATION OF SPATIAL DISTRIBUTION OF CHARGED PARTICLE BEAMS

(71) Applicant: The Research Foundation for the State University of New York, Albany, NY (US)

(72) Inventors: Eric Lifshin, Voorheesville, NY (US); Yudhishthir Kandel, Schenectady, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 14/978,845

(22) Filed: Dec. 22, 2015

(65) Prior Publication Data

US 2016/0180190 A1    Jun. 23, 2016

Related U.S. Application Data

(60) Provisional application No. 62/095,411, filed on Dec. 22, 2014.

(51) Int. Cl.
*G06T 5/00* (2006.01)
*H01J 37/28* (2006.01)

(52) U.S. Cl.
CPC .............. *G06T 5/003* (2013.01); *H01J 37/28* (2013.01)

(58) Field of Classification Search
CPC ........... G06T 5/003; G06T 2207/10056; G06T 5/004; G06T 11/003; G06T 11/006;
(Continued)

(56) References Cited

U.S. PATENT DOCUMENTS 8,106,357 B2  1/2012  Nakahira et al.
2005/0189942 A1  9/2005  Tsao et al.
(Continued)

FOREIGN PATENT DOCUMENTS

JP         4945078 B2    6/2012

OTHER PUBLICATIONS

International Search Report and Written Opinion in Application No. PCT/US15/67440, dated Mar. 11, 2016, pp. 1-10.
(Continued)

*Primary Examiner* — Kenny Cese
(74) *Attorney, Agent, or Firm* — Matthew M. Hulihan; Heslin Rothenberg Farley & Mesiti PC

(57) ABSTRACT

A point spread function (PSF) of a focused scanning particle beam of an observation instrument is ascertained by obtaining a first image (reference image) based on a reference instrument, the reference image being an image of an area of a reference standard, obtaining a second image (observed image) of the area of the reference standard, and the observed image obtained using the observation instrument configured with a set of operational parameters that define a probe size for the observation instrument, the probe size being larger than a pixel size of the reference image, and then determining, based on the reference image and the observed image, the PSF of the observation instrument as a component of a convolution of the reference image that provides the observed image.

20 Claims, 16 Drawing Sheets

(58) Field of Classification Search
CPC ...... G06T 2207/10052; G01N 21/6458; G01N 23/225; G01N 2223/423; G01N 2223/418; G01N 29/0681; H01J 37/28; H01J 2237/226; G02B 21/002; G02B 21/0032

See application file for complete search history.

(56) References Cited

U.S. PATENT DOCUMENTS

| | | | |
|---|---|---|---|
| 2007/0030470 A1 | 2/2007 | Tinnemans et al. | |
| 2007/0085007 A1* | 4/2007 | Araki | H01J 37/265 250/310 |
| 2007/0258706 A1* | 11/2007 | Raskar | H04N 5/23248 396/52 |
| 2010/0091133 A1* | 4/2010 | Lim | G02B 27/58 348/223.1 |
| 2011/0037860 A1* | 2/2011 | Broekaert | G06T 5/50 348/208.1 |
| 2011/0122266 A1* | 5/2011 | Jang | H04N 5/23248 348/208.6 |
| 2011/0129165 A1* | 6/2011 | Lim | H04N 5/23212 382/255 |
| 2012/0097848 A1* | 4/2012 | Lifshin | G02B 21/002 250/307 |
| 2012/0126117 A1 | 5/2012 | Nakahira et al. | |
| 2012/0201477 A1* | 8/2012 | Jesneck | G06T 3/4069 382/279 |
| 2012/0327383 A1* | 12/2012 | Cao | G03F 7/70133 355/67 |
| 2013/0215360 A1 | 8/2013 | Pollack et al. | |
| 2013/0275098 A1* | 10/2013 | Tortai | G06F 17/5009 703/2 |
| 2014/0284496 A1* | 9/2014 | Phillips | G01N 21/278 250/458.1 |

OTHER PUBLICATIONS

Liddle et al., "Probe Shape Measurement in an Electron Beam Lithography System", J. Vac. Sci. Technol. B 22(6), 2004, pp. 2897-2901.

Babin et al., "Fabrication of 20 nm Patterns for Automatic Measurement of Electron Beam Size Using BEAMETR Technique", Microelectronic Engineering, 86, 2009, pp. 524-528.

Guizar-Sicairos et al., "Efficient Subpixel Image Registration Algorithms", Optics Letters, vol. 33, No. 2, Jan. 2015, 2008, pp. 156-158.

"Beametr", aBeam technologies, 2015, pp. 1-2.

Babin et al., Automatic Measurement of Electron-Beam Diameter and Astigmatism: BEAMETR, Physics Procedia, 1, 2008, pp. 113-118.

* cited by examiner

1102

DETERMINATION OF SPATIAL DISTRIBUTION OF CHARGED PARTICLE BEAMS

BACKGROUND

Scanning electron microscopes (SEMs) and scanning ion microscopes (SIMs), along with various lithography tools, utilize a focused beam of either electrons or ions to generate measured signals from a target. The beam may also be used to physically or chemically alter a target. "Target" in this context refers generally to an object or substance that is the subject of the measurement—a sample, in the case of a microscope, or a substrate, in the case of fabrication tools used for electron and ion beam lithography, as examples.

SEMs in particular provide magnified images of targets. Magnification can range from approximately 20× to over 500,000×, depending on type and sample. SEMs are a universal tool used in material science, electronics, geology, forensics, art conservation and environmental research, among other areas. Current drivers of the development of SEM technology include the desire for higher resolution (e.g. nanoscience and microelectronics) and higher throughput (e.g. microelectronics and brain cell mapping), as examples. Current systems often are run at more than 100,000× since the current node for microelectronics is 22 nm or smaller. Therefore, some way of enhancing resolution is desired. Meanwhile, other technology, such as transmission electron microscopy, may require thin samples that are impractical to prepare or very time consuming to use relative to scanning electron microscopy.

BRIEF SUMMARY

Shortcomings of the prior art are overcome and additional advantages are provided through the provision of a computer-implemented method that includes ascertaining a point spread function (PSF) of a focused scanning particle beam of an observation instrument, the ascertaining the PSF comprising: obtaining a first image, the first image being a reference image obtained based on a reference instrument, and the reference image being an image of an area of a reference standard; obtaining a second image, the second image being an observed image of the area of the reference standard, and the observed image obtained using the observation instrument configured with a set of operational parameters that define a probe size for the observation instrument, the probe size being larger than a pixel size of the reference image; and determining, based on the reference image and the observed image, the PSF of the observation instrument as a component of a convolution of the reference image that provides the observed image.

Further, a computer system is provided that includes a memory and a processor in communications with the memory, wherein the computer system is configured to perform a method including: ascertaining a point spread function (PSF) of a focused scanning particle beam of an observation instrument, the ascertaining the PSF comprising: obtaining a first image, the first image being a reference image obtained based on a reference instrument, and the reference image being an image of an area of a reference standard; obtaining a second image, the second image being an observed image of the area of the reference standard, and the observed image obtained using the observation instrument configured with a set of operational parameters that define a probe size for the observation instrument, the probe size being larger than a pixel size of the reference image; and determining, based on the reference image and the observed image, the PSF of the observation instrument as a component of a convolution of the reference image that provides the observed image.

Yet further, a computer program product including a computer readable storage medium readable by a processor and storing instructions for execution by the processor is provided for performing a method that includes: ascertaining a point spread function (PSF) of a focused scanning particle beam of an observation instrument, the ascertaining the PSF comprising: obtaining a first image, the first image being a reference image obtained based on a reference instrument, and the reference image being an image of an area of a reference standard; obtaining a second image, the second image being an observed image of the area of the reference standard, and the observed image obtained using the observation instrument configured with a set of operational parameters that define a probe size for the observation instrument, the probe size being larger than a pixel size of the reference image; and determining, based on the reference image and the observed image, the PSF of the observation instrument as a component of a convolution of the reference image that provides the observed image.

Additional features and advantages are realized through the concepts described herein.

BRIEF DESCRIPTION OF THE DRAWINGS

One or more aspects described herein are particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Aspects described herein present methods and systems for the determination of a point spread function (PSF) of a charged particle beam, such as an electron beam, photon beam, or ion beam. Improvement in the spatial resolution of SEMs, SIMs, and other tools utilizing a probe having a point spread function may be achieved. Future growth of areas such as nanotechnology and microelectronics (a subset of nanotechnology) depend on the ability to visualize very fine structures, including microelectronic and optical interconnects, miniaturized layers, and nanocomposite materials. Aspects described herein can be incorporated into existing and new devices to extend their useful magnification range. This can yield more detailed structural and chemical information than was previously possible for many different kinds of samples or other targets. Knowledge of the PSF may also lead to faster image acquisition, particularly with thermionic source SEMs, and can be useful in instrument performance optimization.

Figure 1:
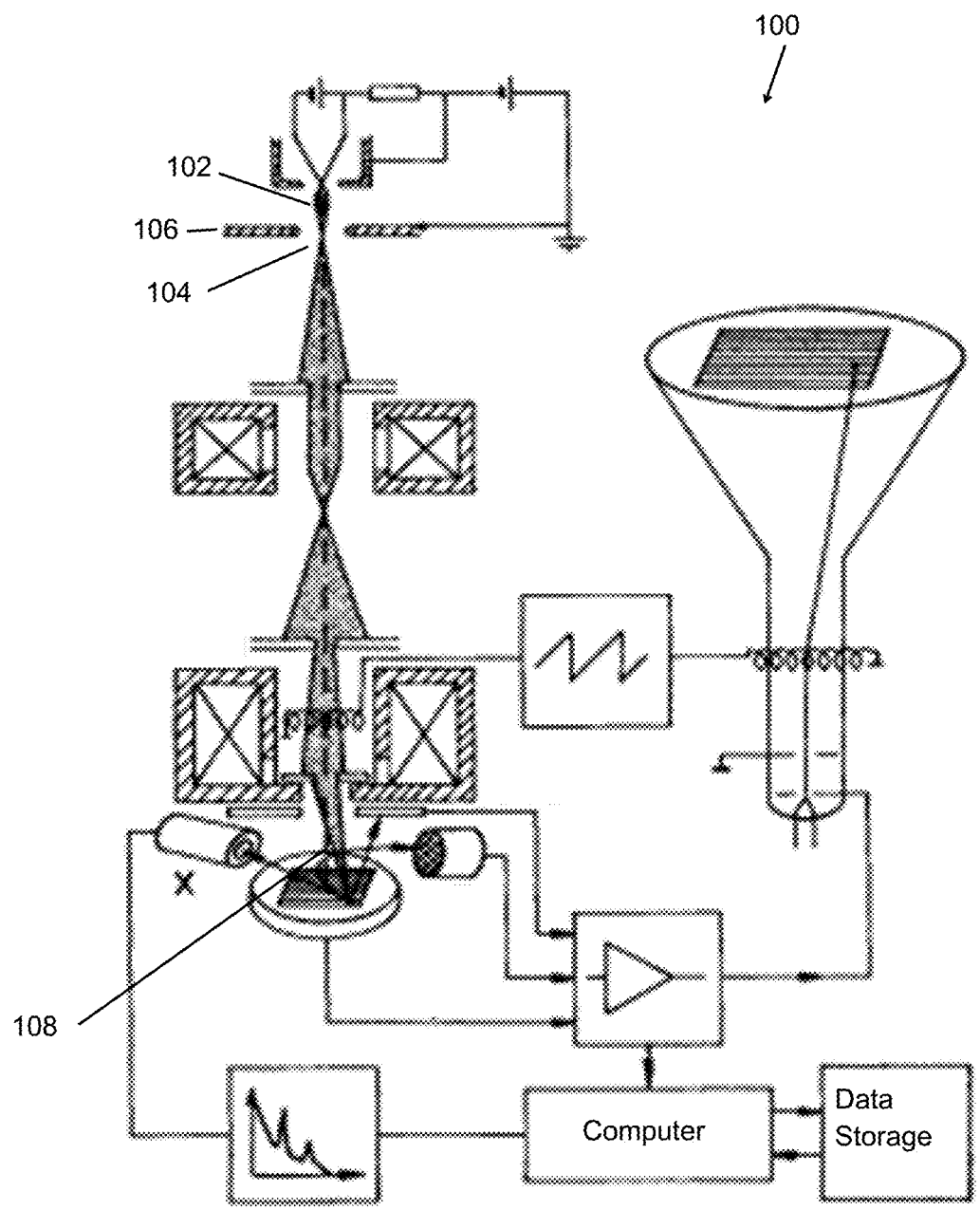
FIG. 1 depicts an example scanning electron microscope.

As noted, a SEM (also referred to herein as simply a "microscope" for simplicity) is an example type of device that may incorporate and use aspects described herein. An example SEM 100 is provided in FIG. 1. In the case of a microscope, the particle beam (probe) 102 is scanned over the sample surface and the intensity of a generated signal, such as secondary or backscattered electrons, is used to form a magnified image of that sample. The image appears on a synchronously scanned image display, such as a light emitting diode (LED) monitor or cathode ray tube (CRT). The magnification of a scanning microscope is the ratio of the distance scanned on the display to that scanned on the sample, and is given as the equation: Magnification=D/S, where D=distance scanned on display, and S=distance scanned on sample. Contrast in the image is a result of point-to-point variations in the intensity of the displayed signal.

A portion 104 of the particle beam is referred to as the crossover, and is formed near the anode 106. The final probe 108 (probe that scans the sample) is nominally an image of the crossover at the sample plane, with the added alterations due to aberrations and diffraction effects. Efforts to determine the size/shape of the crossover have involved placing detectors in the crossover plane or using a scanning source imaging mode. It is often assumed to be Gaussian without furnishing any proof that it is. As is noted above, the crossover 104 is an image of the source. However, it is not a perfect image in that aberrations such as astigmatism in the objective lens, as well other effects limit or modify the final probe shape (PSF). There are two main types of electron sources in use: thermionic (including tungsten filaments and lanthanum hexaboride emitters) and field emitters including cold field emitters, FEGs and Schottky sources (these are not run cold). In the case of thermionic sources, the crossover image is usually the principle factor in determining the PSF, so if it is not round or Gaussian then the PSF will not be either. In the case of the field emitters, some of the other effects may play more of a roll than the crossover in determining the final probe shape, but a full understanding of just what it should look like theoretically has not yet been developed. If one had a detector that could accurately measure the crossover, which may be hundreds of times larger for a thermionic source than the final probe, then it may be possible to postulate the final shape because it is mainly a function of the image of the crossover. In field emission systems, the source demagnification is very small (~10×)—compared to the thermionic source (~1,000×-10,000×). In practice, it is not possible to measure it directly in the plane of the sample/target with existing state of the art. In any case, such measurement is of limited use because, as mentioned above, other factors contribute to determining the final probe size. State of the art electron detectors have ~1 micrometer resolution or ~100× larger than focused electron beams with either source. Therefore, it is practically possible to measure the PSF directly in either case. A knife-edge experiment might be extended down to 10 nanometers under perfect conditions, but that is unlikely because no edge is perfect and transmission and scattering effects make it practically impossible to achieve accurate results. Furthermore, it provides information in only one direction at a time, so multiple scans would be needed over a wide range of angles. Additionally, it would be limited to measuring point spread functions where the central region is at higher intensity than the edges.

In the case of a scanning microscope, accurate knowledge of the shape and distribution of the charged particles in the beam at the point where it strikes a sample is referred to as the point spread function (PSF). Knowledge of the PSF is valuable for various reasons; it can be used to:
  Assess whether the instrument is in good working order (Quality Control);
  Interactively improve the performance of the instrument, for example to provide feedback to control the shape of the focused beam as in the case of astigmatism control, i.e. it provides a means of monitoring and optimizing instrument performance (Automated beam alignment and beam shaping);
  Improve the calculation of photoresist sensitization for e-beam lithography (Dynamic proximity correction);
  Improve the imaging resolution of the instrument through the method known as 'deconvolution', since a measured image can be considered as a convolution of the PSF and the true image of the sample; images may be restored with higher resolution than the probe size (Image Restoration). Restoration refers to returning something to its original/former state. A blurred image is actually a blurred/modified image of the original that being viewed);
  Increase the speed of data collection with the same signal-to-noise ratio (Yield improvement)

Figure 2A:
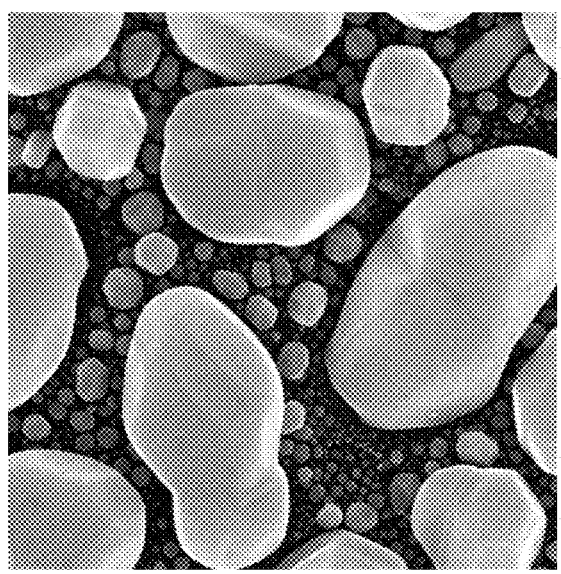
FIGS. 2A-2C depict example true and observed images, along with a convolution representing the convolution of the true image that produces the observed image.
Figure 2B:
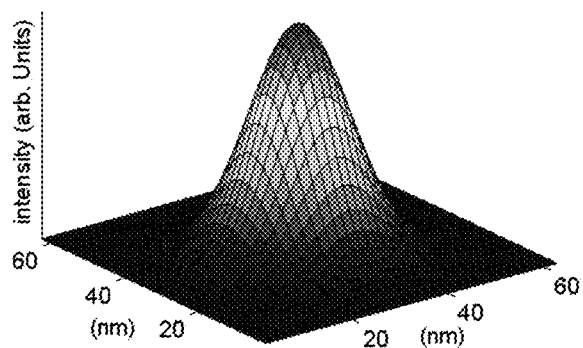
Figure 2C:
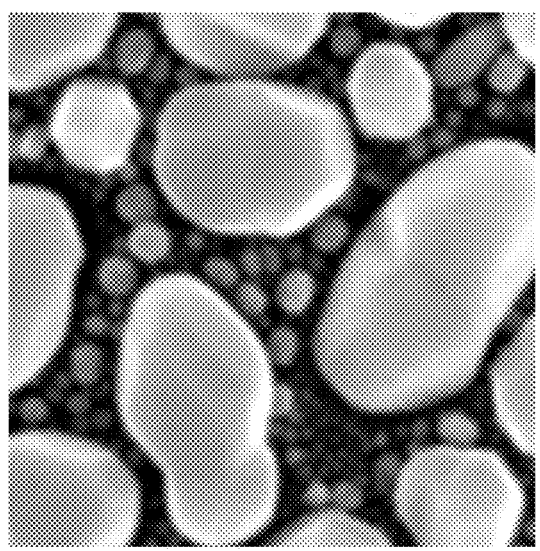

FIGS. 2A-2C depict an example true image (FIG. 2A), along with a convolution (FIG. 2B) representing the convolution of the true image, and the resulting observed image (FIG. 2C), which is the true image convoluted by the PSF. The true image represents the desired image.

In the case of fabrication instrumentation, knowledge of the PSF is used in estimating or controlling the region of the target to be modified, for example in the case of electron beam lithography. Electron beam lithography tools have some imaging capability similar to those of a SEM, and therefore aspects described herein can be applied to e-beam lithography tools.

Resolution is determined by the shape and size of the focused electron (or other particle) beam, how the beam interacts with a specimen, and the type and magnitude of the signal analyzed. Typical values are 1.0-10 nanometers for secondary electron imaging and 20 micrometers or larger in the case of capillary focused x-ray micro-fluorescence.

Figure 3:
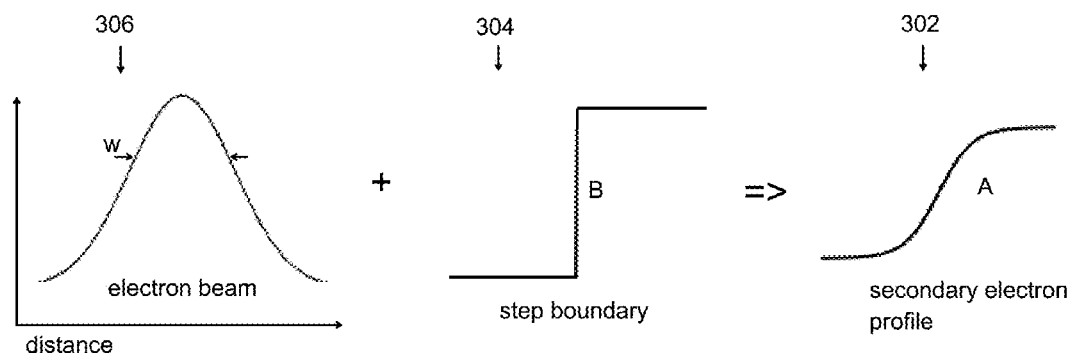
FIG. 3 depicts an interaction of a Gaussian profile electron beam with a sharp boundary.

A simplified depiction of the interaction of a Gaussian profile electron beam with a sharp boundary is shown in FIG. 3. In a perfect situation, the probe would be infinitely small, the probe would generate a signal with very high intensity such that there would be no statistical error associated with the signal measurement, the measurement would do no harm to the sample, and the signal that the probe generates would come only from the point where it meets the sample. In practice, the beam penetrates the sample to an extent. It is capable of exciting the measured signal over some range of volume called the excitation volume. The signal must then exit the sample and be measured. Different signals can escape from different depths. The most commonly measured signal is secondary electron emission. Depending on the beam energy and the sample material, the incoming electrons can penetrate and scatter significantly such that a probe of only 1 nanometer in diameter might generate secondary electrons over a volume of thousands of cubic nanometers. Secondary electrons have small energy, and can only escape from relatively small depths (~10 nm). Thus, only those electrons generated near the surface escape and are measured. As the probe is at a minimum diameter at the point of impact, the resolution approaches the probe diameter. Other signals, like backscattered electrons, have higher energies and therefore the excitation volume can be quite large relative to the probe size unless the beam energy is reduced significantly. Thus, referring to FIG. 3, the secondary electron profile 302, (A), which the observed image represents, would be as sharp as the step 304 (B) if the beam 306 had width W equal to pixel width and the interaction volume were negligible, but this is not the case. At high magnification, pictures appear blurry. If one knew the signal transformation or "blurring" function (PSF), it would be possible to deconvolute the observed image 302 (A) and determine the step 304 (B). As noted, difficulty arises because the size of the electron beam is very small and the interaction volume not easy to calculate. Accurate determination of the PSF at the plane of the target using any standard measurement techniques is generally not possible because the dimensions of charged particle probes to form high magnification images or produce desired target alterations are often less than 100 nanometers. This is smaller than the spatial resolution of presently used electron or ion detectors, which are not presently capable of directly measuring nanometer scale beams. With respect to Transmission Electron Microscopes (TEM), in principle the lenses of the TEM could be used to produce a magnified image of the illuminated spot itself (the PSF), but the magnifying lenses themselves would add aberrations. Thus, sizing and shape of small probes have only been estimated indirectly, but to be useful for purposes of useful deconvolution they must be known to greater accuracy.

Figure 4A:
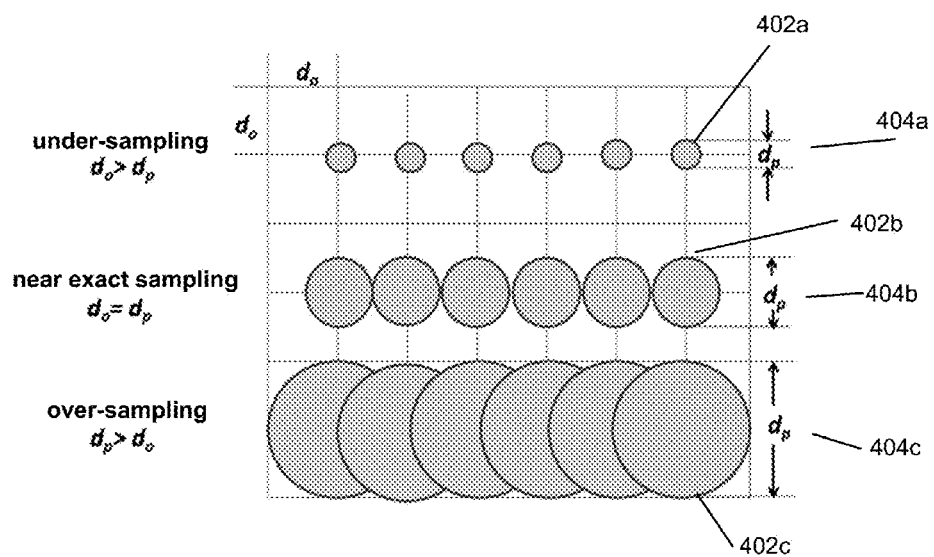
FIGS. 4A-4B illustrate under-sampling, over-sampling, and near exact sampling based on probe sizes.
Figure 4B:
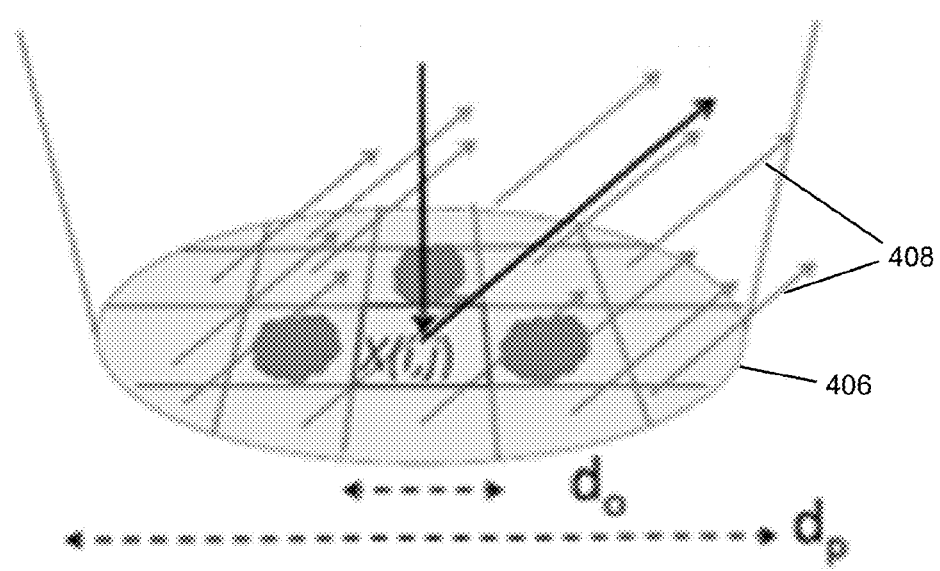

FIGS. 4A-4B illustrate under-sampling, over-sampling, and near exact sampling based on probe sizes (404a, 404b, 404c). The individual circles 402a, 402b, 402c represent probe spots. Under-sampling results when probe size, $d_p$ 404a, is smaller than pixel dimension, $d_0$. Near exact sampling results when probe size $d_p$ 404b (diameter of the probe) matches pixel dimension $d_0$ (length of the side of a square pixel), and over-sampling results when probe size $d_p$ 404c is larger than pixel dimension $d_0$. FIG. 4B depicts a further illustration of over-sampling, showing that if the beam 406 is larger than the structure of interest (pixel size, represented as each square of the grid in FIG. 4B), then the measured signal 408 is the combination of the signals from all of the pixels sampled. A measured signal S is the sum of the signals from all of the points sampled within a given probe spot, and can be expressed by the following equation:

$$S(i,j) = \sum_{k=1}^{m}\sum_{l=1}^{n} PSF(k,l) X\left(\left(i+\frac{m-1}{2}\right)-k, \left(j+\frac{n-1}{2}\right)-l\right) \quad \text{(Eq. 1)}$$

As a result, scientists desiring to increase resolution are left with a choice of either continuing to shrink probe size, or accurately determining the PSF and using deconvolution (which itself requires an accurate procedure). In this regard, reducing probe size to achieve higher resolution has been the major thrust of SEM development since it was first introduced commercially in 1965. Today, probes down to ~0.5 nm in diameter are possible in SEMs using brighter sources, but they are complex and expensive to produce from a hardware point of view. Further developments may necessitate expensive hardware such as aberration correctors and energy filtered sources and detectors.

As a general mathematical description and restatement of Eq. 1, the relationship between an observed image and a true (reference) image is given by:

$$I_{obs} = psf \otimes I_{ref} + \text{noise} \quad \text{(Eq. 2)}$$

$I_{obs}$ and $I_{ref}$ are the observed image and reference images, respectively, and the $I_{ref}$ is convoluted by the psf. Thus, $I_{ref}$ and $I_{obs}$ are known matrices describing the observed and reference images respectively, and the object is to determine psf, the matrix describing the point spread function, while accounting for or eliminating the noise term. The noise is present due to statistical fluctuations in the measured signal.

A determined PSF corresponds to a given instrument under the particular set of operating conditions for that instrument condition at the time of the measurement. As described above, determination of the PSF may be useful for various reasons, including the following:

Quality Control: It can be used to define the operating state of a given SEM, for example to compare the status of the instrument at a given moment relative to a benchmark of performance, such as when it was delivered. This can facilitate identification of performance degradation relative to when the instrument was installed.

Automated Beam Shaping: It can be used to optimize instrument performance, such as to minimize beam size or to achieve a desired beam shape, as is the case for astigmatism adjustment to make the beam more circularly symmetric.

Resolution Improvement: It can be used to form higher resolution, improved-contrast images based on deconvolution/regularization algorithms in which the effects of blurring due to the extended beam size and noise are minimized, and give improved images that more accurately approach that of the true structure being imaged.

Figure 5:
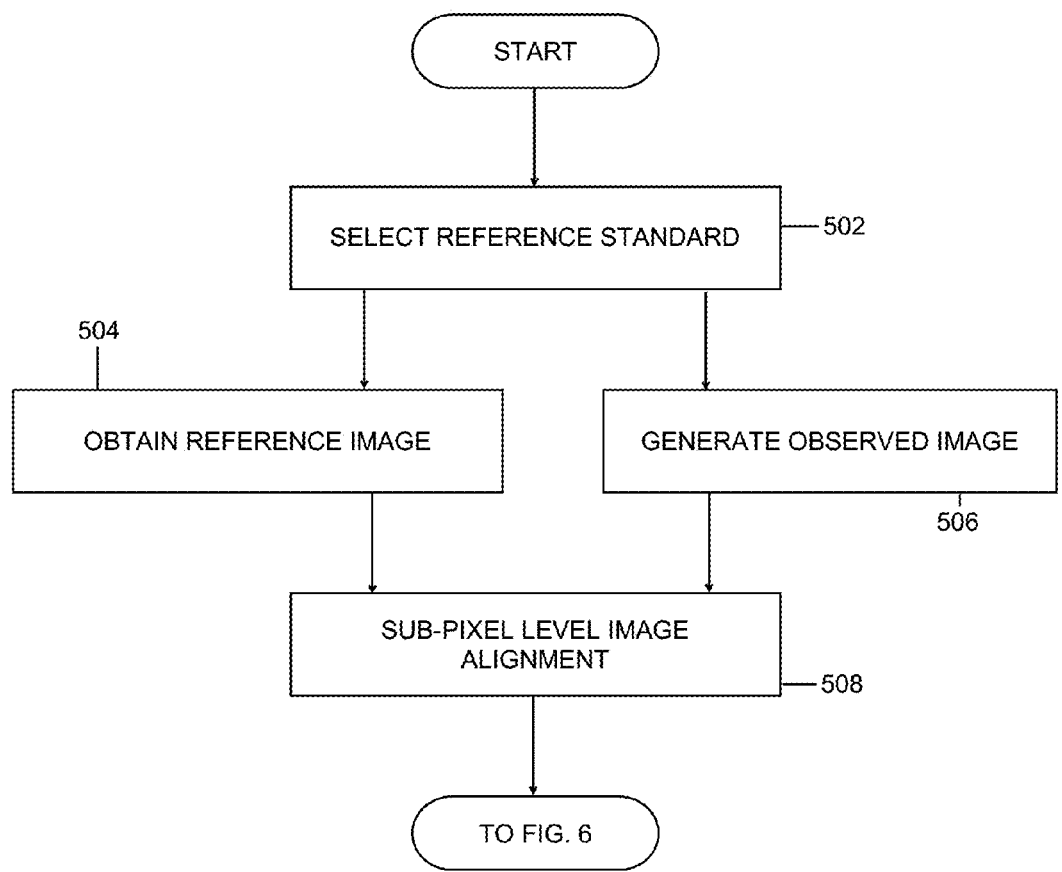
FIGS. 5-7 depict an example method for determining a point spread function in accordance with aspects described herein.
Figure 6:
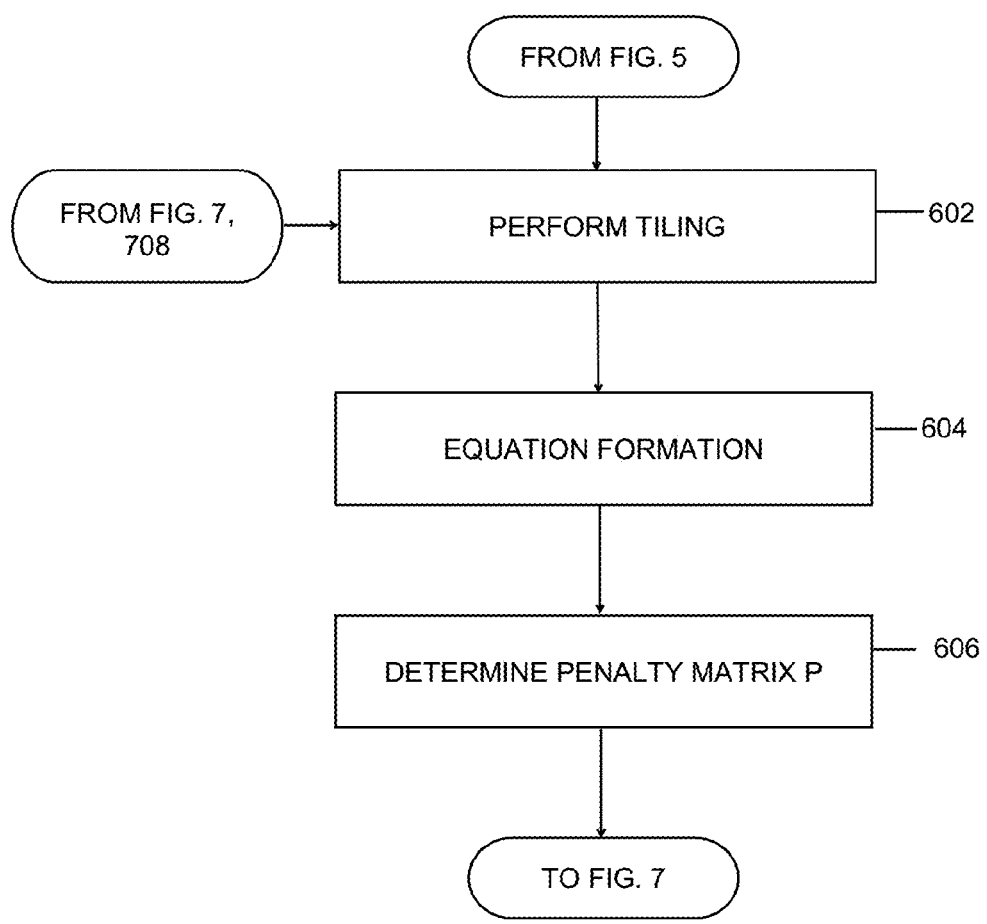
Figure 7:
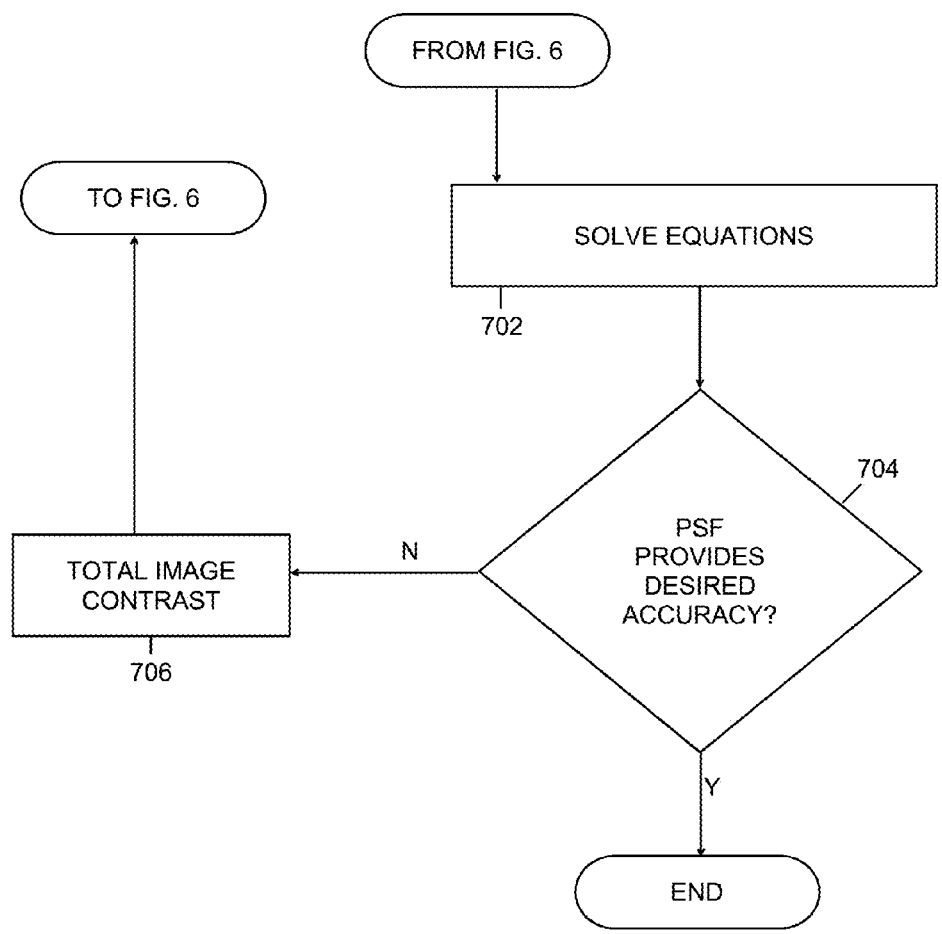

An example approach to PSF determination in accordance with aspects described herein is now provided with reference to FIGS. 5-7. In some examples, one or more aspects are performed by a computer system, for instance a computer system associated with the instrument itself, for instance a controller thereof. Performance by such a computer system, or other computer system(s), may facilitate improvement in the functioning (measurement, calibration, etc.) of the instrument itself.

Initially, a reference standard is selected (502). A reference image and observed image are to be obtained based on that selection, as described below. In some embodiments, the sample is fabricated specifically for purposes described herein, though in others it may be selected from commercially available standards (for example those offered by Ted Pella, Inc., Redding, Calif., U.S.A.), with attention to one or more of the following example reference standard characteristics provided below as (a) through (i):

(a) Sufficiently fine detail that is equal to or smaller than the probe size possible with a high resolution SEM used to prepare the reference image, for example (but not limited to) several nanometers or less gold particles on a carbon substrate. In accordance with some embodiments, the object pixel size $d_o$ is defined as being equal to the probe size $d_p$. The rationale is that each pixel sampled can, to an extent possible, provide unique information about only that pixel, and is thus referred to as the reference, or true image. Imaging of gold particles on a carbon substrate provides an acceptable scenario to more accurately/effectively meet the desired criterion (approximate $d_o$ to $d_p$).

(b) It may be desired to have a random distribution of feature sizes that are larger than the pixel size. This may be useful in assessing the contrast transfer function. It may also be possible to use a random dot array in which very small features are distributed such as to have a random spacing.

(c) The features may have a high contrast relative to their background. By way of example and not limitation, gold on carbon may be preferred because of the major difference in their secondary electron and backscatter yields at all beam energies, but other combinations of materials that provide high levels of contrast may be used.

(d) It is desired that the standard be stable over a sufficiently long period of time, as it will be imaged in both the reference microscope (high resolution image-pixel size equals probe size) and what is referred to herein as the "observation microscope", which refers to the actual microscope to be used with the method (i.e. the microscope and conditions for which the PSF is being determined). In practice, measurements of the standard may be made prior to those in the observation microscope (the one used by, e.g., a customer for this technique) as the user may or may not have access to such a microscope (the reference microscope that measures the standard) but would still benefit from pre-measured images of the reference standard. Stability of the standard refers to the property that the structure will not alter over time, for instance due to chemical or physical degradation.

(e) The reference standard may have minimum susceptibility to contamination or charging associated with long or repeated exposures. This may be minimized by some form of in-situ cleaning with a commercial chamber cleaner such as with an Evactron® product (offered by XEI Scientific, Inc., Redwood City, Calif., U.S.A., of which EVACTRON is a registered trademark) or by gentle ex-situ plasma cleaning or ultraviolet light cleaning.

(f) Since the features of interest may be relatively small, the standard may include some form of fiducial markings that enable a user to locate the same area in the observation microscope as that imaged in the reference microscope.

(g) One variant for the standard may be a repeating regular structure with features/variations approximately equal in size to the pixel size—for example an array of round dots, spheres, crossed lines, or other structures with well-defined edges—as could be established by self-assembly or by a technique such as e-beam lithography. In this case, it may not be critical to position the exact same region of the reference standard under the beam in the observation microscope as in the reference microscope.

(h) Another variant is to image the reference structure in a different type of reference microscope or a similar type using different signal or signal collection conditions. It may be desired to introduce some form of transformation in the image so as to produce a suitable reference image to be compared with that obtained in the observation microscope. An example is to image a test structure in a SEM at high beam energy where the resolution is better and transform it into an image at low beam energy with similar resolution as a reference image even if it is not possible to obtain such an image of comparable resolution in the reference microscope. Another example would be to use a scanning transmission electron microscope image obtained at relatively high beam energy and convert it to another form of image at conventional observation SEM conditions.

(i) The reference standard may be in a form that it can be mounted in a given SEM at the same time as the sample to be examined. As many microscopes can accommodate multiple samples on standard mounting stubs, the standard could be mounted in one of those positions. Alternatively, the mounting stub with the sample could be inserted in a specially fabricated sample holder that also could include the standard. As an example, the sample holder could be a large circular or square fixture with the standard mounted on its periphery with a space in the middle into which the sample stub could be inserted. A set screw on the side of this holder could be used to fix the location of the sample such that it is approximately on a parallel plane to the reference standard and thus minimize differences in the distance to the pole piece so both would be in-focus at the same time.

Based on the reference standard, reference and observed images are obtained. With respect to the reference image, digital image(s) of one or more areas of the reference standard may be obtained using a high resolution (reference) microscope, or may be computed/simulated as the image that would theoretically be obtained if the standard were imaged using the reference instrument. The reference image is to be used for a PSF determination as described herein and is referred to as $I_{ref}$. The PSF determination is of the PSF of the observation instrument, based on the observed image $I_{obs}$ obtained from imaging the reference standard with the observation device.

Thus, once the reference standard is selected, for instance based on all or some of (a) through (i) above, then the preselected area is imaged in the observation microscope for the desired set of operating conditions (the one actually used by the researcher, i.e. for which the PSF is desired to be determined) giving a digital image, $I_{obs}$. Several factors may be considered when obtaining the reference and/or observed images. They include: (i) locating the same or a similar region (for instance as close as possible) of the reference standard, which can be done by, for instance, a combination of mechanical and electronic shift, (ii) selecting a number of pixels that is neither too small (leading to a lack of information) or too large (leading to long data collection times)—in some embodiments, pixel-size resolution is provided by setting probe size equal (approximately) to pixel size (i.e. less than 10-20% deviation between their sizes, as an example), (iii) choosing a probe current and dwell time per pixel that provides high (about 99%) signal-to-noise ratio without being associated with drift of the sample position, (iv) minimizing vibration or fields that might distort the PSF (e.g. vibration less than one-tenth of pixel width in amplitude), (v) minimizing or eliminating image saturation, (vi) setting brightness and contrast to acceptable levels, and (vii) minimizing contamination or damage to the sample during data collection. In some examples, values or a range of values can be specified for some of these constraints for obtaining $I_{ref}$ and $I_{obs}$ (if applicable). With respect to (iii) above, drift of less than 1% may be desired during image acquisition. In some examples, this is achieved with short-term data collection, i.e. by obtaining a very rapid series of pictures with relatively short exposure time. Each successive picture may be aligned with the preceding picture. The series of pictures is then used to form the image (e.g. reference image).

Referring back to FIG. 5, the reference image is obtained (504) based on simulating the image that would be obtained by the reference instrument if it images the selected reference standard, or by actually imaging the reference standard using the reference instrument. Using considerations noted above, the reference image may be obtained under operating conditions of, as examples: (i) a high (20:1) signal-to-noise ratio, (ii) minimal or no vibration (<10% pixel width in amplitude), (iii) minimal or no drift (less than 1%), (iv) no image saturation, (v) spot size is substantially equal to probe size (within 10%), (vi) appropriate brightness/contrast are applied. Additionally, an observed image of the reference standard is generated (506), in which the observation device is used to generate the image, which may be obtained under operating conditions of, as examples: (i) minimal or no random shift (vibrational noise, etc.), (ii) minimal or no observation device associated drift, (iii) high (20:1) signal-to-noise ratio, (iv) no image saturation, (v) no brightness offset applied, (vi) gain in the image is proportional to the signal.

Two aspects are recognized at this point. First, certain adjustments are made to $I_{ref}$ and $I_{obs}$ before the equation (Eq. 2 above) is used. In particular, the images can be registered, meaning that they overlay each other (with no shift, rotation, shear, or change in magnification, see sub-pixel image alignment herein). Also, the brightness and contrast value of the blurred (observed) image can be made consistent with brightness and contrast of the reference image (see brightness and contrast adjustment herein). Second, the above Eq. 2 is a matrix equation including the convolution operator. As described in connection with equation formation below, it can be recast into a format that facilitates determination of an optimal solution for the PSF absent an assumption as to the shape of the probe (that is a functional shape, such as Gaussian).

After the reference image generation (504) and tool image (blurred image) generation (506) at the given conditions, the approach then performs sub-pixel image alignment (508). In this regard, one or more of the following are performed:
A. Manual alignment, e.g. using selection of control point(s) in the reference image and blurred image: points at or near the center of the small features are selected, the points being those that are relatively unlikely to shift in the blurred image. Care may be taken to select the geometric center rather than, for instance, the point of highest intensity or lowest intensity center. A robust rigid affine transformation matrix is calculated using the control points data.
B. Auto-registration:
  i. Translation of sub-pixel alignment using, e.g., a Fourier-based method for calculating image shift
  ii. Intensity-based difference minimization image registration method
  iii. PSF shift-based method: Calculate the PSF at each position roughly and fit the robust rigid affine transformation to obtain the actual change in translation
  iv. A hybrid sub-pixel Fourier method and PSF shift method
C. Iterative PSF estimation and registration method (which may be costly but accurate)

The process continues to FIG. 6 with tiling being performed (602) in this example, in which the image may be divided into adjacent or overlapping tiles to perform the PSF calculation (below) in each tile separately. This allows for noise averaging in the final calculation and reduces the chances of significant noise in a small patch of the image affecting the PSF calculations for the entire image. Aspects described herein leave open the solution to Eq. 2 above for either the whole image or patches of the image that are stepped in various increment sizes to minimize the effect of noise. When multiple patches are used, they may be averaged to give the final PSF and/or compared with each other to see if there is any position dependence. In some embodiments, tile(s) may be weighted differently based on their information content, perhaps to temper or eliminate influence of some tile(s) on the final PSF.

The method continues to 604 for equation formation. A restatement of Eq. 2 above (which itself is a restatement of Eq. 1) into a more standard form for solving such matrix equations is provide as:

$$b_{ij} = \Sigma_{k=1}^{m} \Sigma_{l=1}^{n} a_{kl} X\left(i + \frac{m-1}{2} - k, j + \frac{n-1}{2} - l\right) \text{ where } Xa = b \quad \text{(Eq. 3)}$$

In this case, the matrices $I_{obs}$ and the PSF are transformed into a vector format as 'b' and 'a' (respectively) and the reference image into a block circulant matrix X As the noise is now included in the expression Xa=b, it may be further transformed into a more complicated function, (X+λP)a=b, that includes a new term λP, which is referred to herein as a penalty term. The choice of the penalty term may be based on factors that can include (but are not limited to) features that are unique to image formation from microscopic observation. Examples of such features include non-negativity of X, the nature of edges, distribution of the residual, choice of residual functional, characteristics of the microscope and/or sample, pre-known properties of the PSF, and pre-know properties of the standard and beam interaction therewith. These factors can influence the choice of optimization strategies that provide better selection of a PSF to the data.

Accordingly, for equation formation (604 of FIG. 6):
(i) Recast the pixel values from the observed image corrected for contrast as vector b and recast the pixel values from the reference image as matrix X to find the values of a. In addition, regularization is added for robust restoration by considering the regularizers that form the minimization of Gaussian noise (ridge regression)
(ii) Addition of regularization for robust restoration: Consider the regularizers that form the minimization of Gaussian noise (Ridge regression). Additionally, consider the tapering constraint at the edge, constraint of vector a is to be applied in its matrix form even though it is cast as a vector above. Additional regression methods can be applied above to increase the robustness of the solution. Use Huber penalty function for solving for a.

The method also determines the penalty matrix P (606, FIG. 6). Matrix P can depend on one or more of (as examples): the noise characteristics of the sample geometry, sample material layout, tool under the evaluation, and parameters specification of the tool under operation. Proper choice and selection of P provides robustness for the method. If the standard is selected to have few edge effects and high contrast, given the image is taken with extra care steps mentioned prior, P can be approximated by a scalar.

The method continues to 702 of FIG. 7 with solving the following equations:

$$H = 2(X+\lambda P)^T(X+\lambda P)$$

$$f = -2(X+\lambda P)^T b$$

subject to a ≥ 0 and Σa=1. One possible strategy for solving the functional minimization problem defined above is to solve using the Quadratic Programming (quadprog) MATLAB routine with the Interior point trust region method option used and pyramid level 3 used (MATLAB is developed by The MathWorks, Inc., Natick, Mass., U.S.A., and is a trademark of The MathWorks, Inc.). Alternatively, one may use any SDP, SOCP, QDQP, or QP solver to solve the above problem.

Many SEMs automatically readjust brightness and contrast setting with changes in certain parameters, such as scan speed and beam current. The latter, however, can be a problem because an image formed of a given structure, in this case the reference structure, can have higher contrast than the identical structure formed with a larger beam. Additionally, at this point, the units of the PSF are dimensionless and the total area of the PSF curve in the X and Y directions is normalized to give at total value of unity. In accordance with aspects described herein, a total image contrast (TIC) approach (as opposed to the point-to-point definition found in most art) is used and described in further detail herein. It also includes a procedure for adjusting the pixel values of a blurred image to be self-consistent with blurring effect from the determined PSF. This process may involve some degree of iteration in that once a PSF is determined by procedures described herein, then a check of its accuracy (704) is made to determine whether the application of the above convolution equation provides a significant enough match between $I_{ref}$ and $I_{obs}$, indicating an accurate PSF. In some examples of this check, a test of the extent to which the PSF changed from the last iteration is made (e.g. changed less than some threshold). Additionally or alternatively, the produced image may be observed and a determination made about whether the resolution improvement is satisfactory. If the determined PSF does not provide the desired level of accuracy, a Total Image Contrast approach is performed (706) to provide an adjusted image, in which an approximate blurred image (im_blur) of the reference image is determined (e.g. computed using the determined PSF) that resembles the tool (observed) image closely (e.g. to within some threshold). Then, total contrast and brightness for both im_blur and the observed image are determined (e.g. computed). The total contrast and brightness of the im_blur image and the observed image should be equal. If not, then the pixel values in the observed image may then be adjusted according to the contrast and brightness. The process iterates by returning to FIG. 6, eventually producing a new, refined PSF. At each iteration, a more accurate PSF is provided that is tested by way of a comparison between (i) the reference image blurred with the (refined) PSF and (ii) the last adjusted observed image, and more specifically a contrast and brightness comparison, in some examples. Eventually, a PSF is determined that provides a desired level of accuracy, i.e. the contrast and brightness of the compared images are close enough in value (below some desired difference threshold). In experimentation, two to three iterations typically yielded an accurate enough PSF.

It is reasonable to expect that the contrast of a blurred image will be less than that of a high resolution image of the same structure since a point spread function (PSF) has an averaging effect on the data from each pixel it is placed on to form an image. It is also reasonable to assume that the average intensity obtained from the entire image of a given structure will stay the same even as the PSF of the beam used to form the image gets larger.

In thermionic instruments, the probe current is often determined by the condenser lens setting. Rather than specify the condenser lens current, some manufacturers choose to use a metric such as spot size or beam intensity index (BI) as the determining factor for probe current. In the case of thermionic source instruments, high BI is associated with a large probe and more current (a better signal to noise ratio), and low BI is associated with a small probe and low current. In the equipment used in some experimentation in connection with aspects described herein, the BI ranges from 1 to 20. In practice, to study how the PSF varies with BI, we take a BI series of images starting with a low BI (e.g. 2) as a reference image and we are eventually forced to readjust the brightness and contrast settings to obtain a reasonable image as we increase BI. This means to choose brightness and contrast values that center around mid-gray levels but do not have regions that saturate the detection system or are so dark as to not have any apparent detail. In fact, as the BI is increased, the overall gain of the detection system is decreased (for instance by way of feedback/automatic adjustment applied by the equipment) to accommodate for the fact that the system would be saturated. A similar action takes place when the scan speed (dwell time per pixel) is changed; when the beam slows down, it does not drive the imaging chain into saturation. Image series that show that control called contrast (which along with the brightness appears in the header file of the image) appears to be a multiplier to pixel intensity and the brightness appears to be a constant factor (DC level added to the pixel intensity).

Contrast is usually limited to the relationship between two points within an image, namely of the form:

$$C = \frac{S_2 - S_1}{S_2 + S_1} \text{ where } S_2 > S_1 \qquad \text{(Eq. 4)}$$

Note: Depending on the definition used, the denominator is also sometimes only $S_1$ or $S_2$ Since this does not help in describing the entire image, a new definition, that of "total image contrast", C, is proposed as follows:

$$C = \frac{1}{mn} \sum_{i=1}^{m} \sum_{j=1}^{n} \frac{|I_{i,j} - I_{ave}|}{I_{ave}} \qquad \text{(Eq. 5)}$$

where the image contains m by n pixels and $I_{i,j}$ is the intensity of a pixel at (i,j) in the image. The value of this number is in the range of 0 to 255 for 8 bit images and 0 to 65,535 for 16 bit images and should not be taken as a direct measurement of the signal strength, for example the number of secondary electrons, but rather a signal that may be directly proportional to it combined with a digital offset (the brightness) and possibly a non-linear effect called the gamma control which may be kept at 1 to keep it linear. The average pixel intensity is given by:

$$I_{ave} = \frac{1}{mn} \sum_{i=1}^{m} \sum_{j=1}^{n} I_{i,j} \qquad \text{(Eq. 6)}$$

These equations were applied to a series of images for the range of BI=3 to BI=15 and it was found that the average intensity for the BI=3 image was 26,505 and the total image contrast was 0.4672. It was then observed that the latter number increased more or less with BI and the average intensity was generally a bit higher than the BI=3 image, but varied from BI to BI reflecting the operator's brightness and contrast preference.

The various BI images were then more objectively adjusted above BI=3 to give values consistent with the following:

The average intensity value stays the same as the reference.

The total image contrast is consistent with that obtained by convoluting the reference image with the PSF determined for that BI. Additional iteration here on the PSF determination itself may be desired since it may also benefit from some similar adjustments to ensure consistency.

Adjusted images, consistent with the above points, can be created by the following equation:

$$I_{ij}^{adj} = sf \times I_{ij}^{old} + os \quad \text{(Eq. 7)}$$

where sf is a scale factor, os is a digital offset and $I^{old}$ is the as-recorded image. Note this is a matrix equation that applies to all values of $I_{i,j}$ for both the old (original) and adjusted image pixels.

The following procedure describes how the scale factor and offset can be determined and thus provide adjusted images for restoration:

1. Calculate the average intensity and total image contrast of the reference image by means of Eqs. 5 and 6. The quantities will be designated A1 and C1.
2. Calculate the blurred image expected for a given BI (PSF already determined) from: $I_{blurred} = I_{ref} \otimes PSF$ (using the conv2 function of MATLAB, as an example).
3. Calculate the average intensity and total image contrast of the blurred image again using Eqs. 5 and 6. These quantities will be designated A2 and C2.
4. Calculate the average intensity and total image contrast for the actual higher BI images (blurred images) again with Eqs. 5 and 6. These quantities will be designated as A3 and C3.
5. Compute the scale factor from the following:

$$sf = \frac{A1 \times C2}{A3 \times C3} \quad \text{(Eq. 8)}$$

6. Compute the offset from the following:

$$os = \left(1 - \frac{C_2}{C_3}\right) A1 \quad \text{(Eq. 9)}$$

7. Compute the adjusted image from Eq. 7.

Derivation of Eqs. 8 and 9:

Define the average intensity of the adjusted image as A4 and the total image contrast as C4.

From Eqs. 6 and 7 and the condition that A1=A4 (average intensity is preserved):

$$I_{ij}^{adj} = sf \times I_{ij}^{old} + os$$

$$A4 = \frac{1}{m \times n} \sum_{i=1}^{m} \sum_{j=1}^{n} I_{ij}^{adj} =$$

$$\frac{1}{m \times n} \sum_{i=1}^{m} \sum_{j=1}^{n} (sf \times I_{ij}^{old} + os) = \frac{sf}{m \times n} \sum_{i=1}^{m} \sum_{j=1}^{n} I_{ij}^{old} + os = sfA3 + os = A1$$

$$os = A1 - sfA3$$

Then determine C4, which equals C2 (the total image contrast of the PSF blurred reference image), using Eq. 5 and again Eq. 7

$$C4 = \frac{1}{mn} \sum_{i=1}^{m} \sum_{j=1}^{n} \frac{|I_{i,j}^{adj} - I_{ave}|}{I_{ave}} = \frac{1}{mn} \sum_{i=1}^{m} \sum_{j=1}^{n} \frac{|sfI_{i,j}^{old} + os - A4|}{A4}$$

as shown above: A4=sfA3+os and therefore:

$$C4 = \frac{1}{mn} \sum_{i=1}^{m} \sum_{j=1}^{n} \frac{|sfI_{i,j}^{old} + os - sfA3 - os|}{A4} = \frac{A3sf}{A4mn} \sum_{i=1}^{m} \sum_{j=1}^{n} \frac{|I_{i,j}^{old} - A3|}{A3}$$

$$C4 = \frac{A3C3}{A4} sf$$

since our requirements are C4=C2 and A4=1 then:

$$sf = A1C2/A3C3$$

and A1=sfA3+os therefore:

$$os = A1 - sfA3 = \left(A1 - \frac{A1C2A3}{A3C3}\right) = \left(1 - \frac{C2}{C3}\right) A1.$$

As described herein, determination of an accurate PSF describing the probe is useful not only for purposes of image restoration/resolution enhancement, but for other purposes as well. For instance, it can be used to define operating state of a given instrument, for example to compare the status of the instrument at a given moment relative to a benchmark of performance, such as when it was delivered and initially setup. It can be used to identify performance degradation relative to when it was installed. Additionally, it can be used in the optimization of instrument performance, such as to achieve a desired beam shape, as is the case for astigmatism adjustment.

Figure 8:
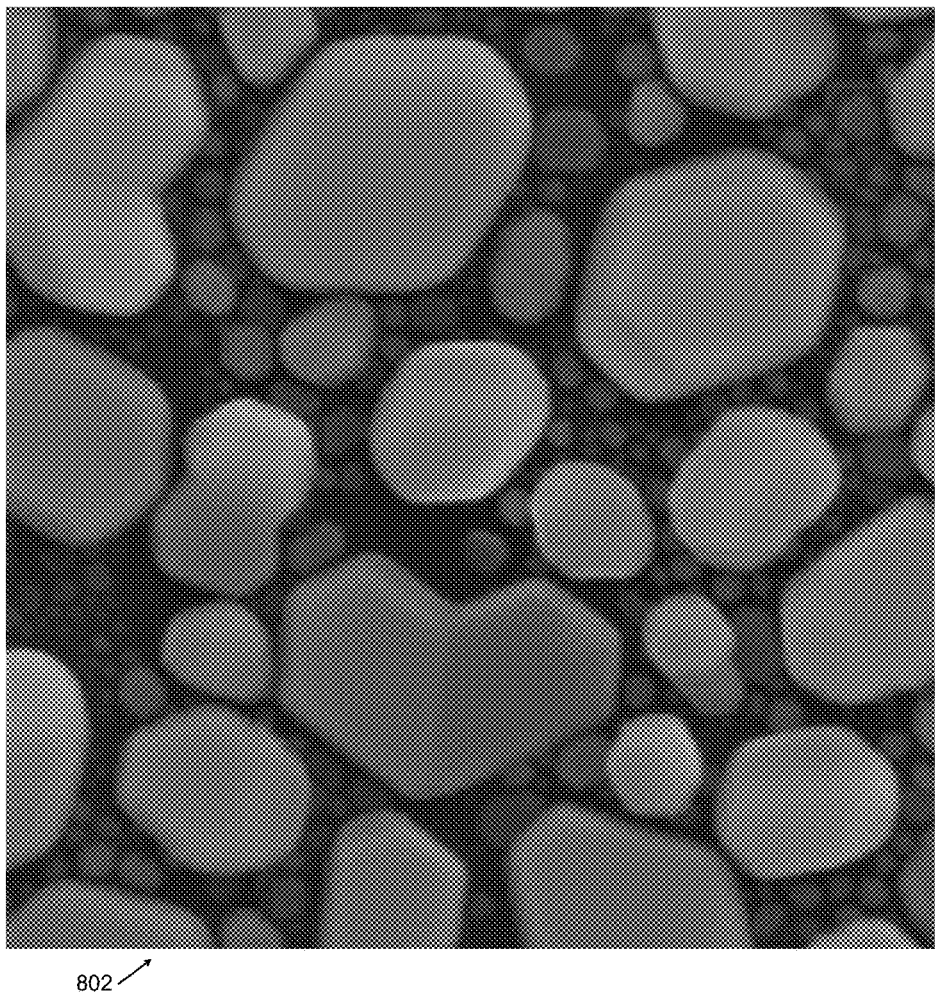
FIG. 8 depicts an example reference image in accordance with aspects desctibed herein.
Figure 9:
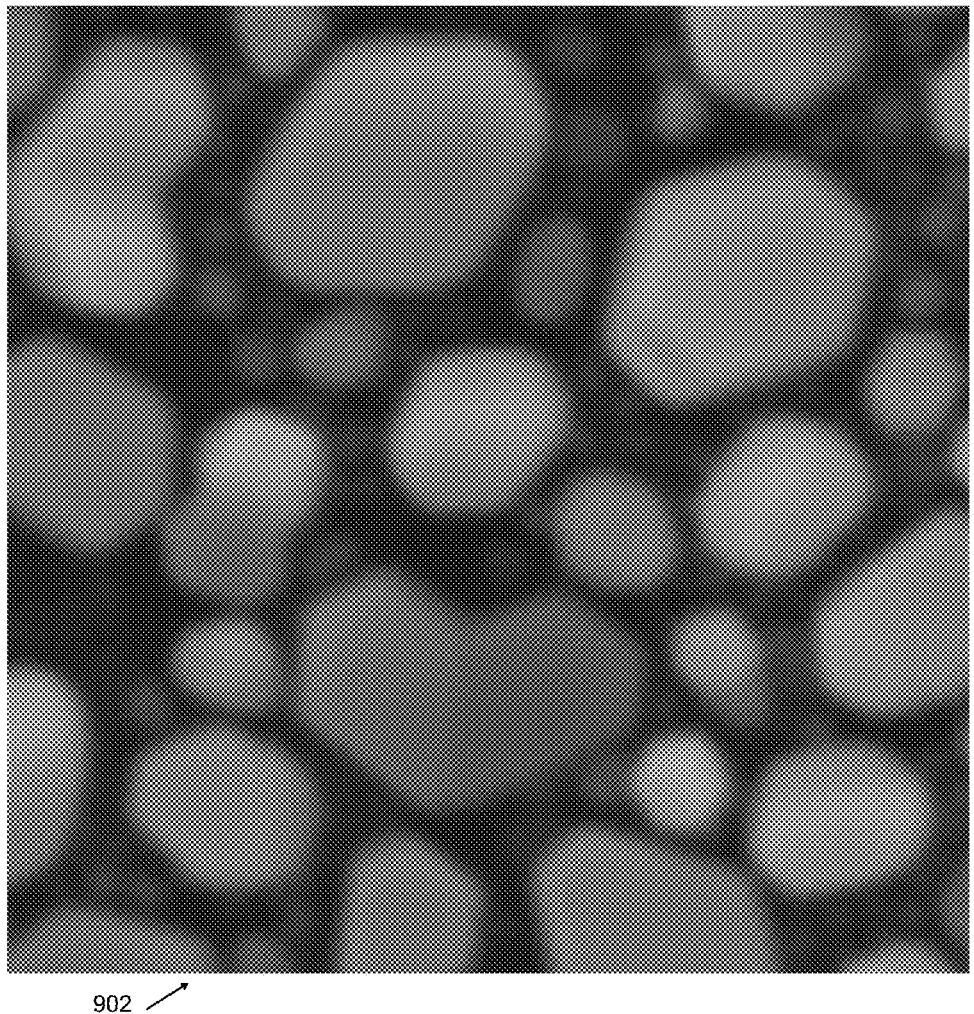
FIG. 9 depicts an example observed image in accordance with aspects described herein.

Now provided is a specific example of PSF determination. In this example, images were collected on a Ted Pella, Inc. provided gold-on-carbon standard from the same area at 20 keV (images, shown as FIGS. 8 and 9). The image in FIG. 8 is the reference image 802, while the image of FIG. 9 is the observed image 902. The field of view in each is approximately 1 micrometer. The beam is larger in the case of the observed image and therefore the image is less sharp. Because it is less sharp, some degradation in contrast took place that can be adjusted-for by the method described herein. The resulting PSF 1002 determined using aspects described herein is given in FIG. 10.

In another embodiment, the reference image and observed image are obtained for two different energy levels on the same equipment, for instance 2 keV and 30 keV, with the 30 keV image serving as the reference image and the 2 keV as the observed image. In this example, adjustment for the change in secondary yield with voltage may not be performed, though it could be if desired. That is, such adjustment could be incorporated into the model described herein. For example of this embodiment, it may be assumed that the ratio of secondary yields of gold to carbon is the same for the images.

In any case, the PSF obtained in as described herein could then be used to improve the resolution of the observed image using any of various methods, be they known or unknown at present. In this regard, several methods of improving resolution of a relatively blurry image given the point spread function of the probe are known to those having ordinary still in the art.

Figure 10:
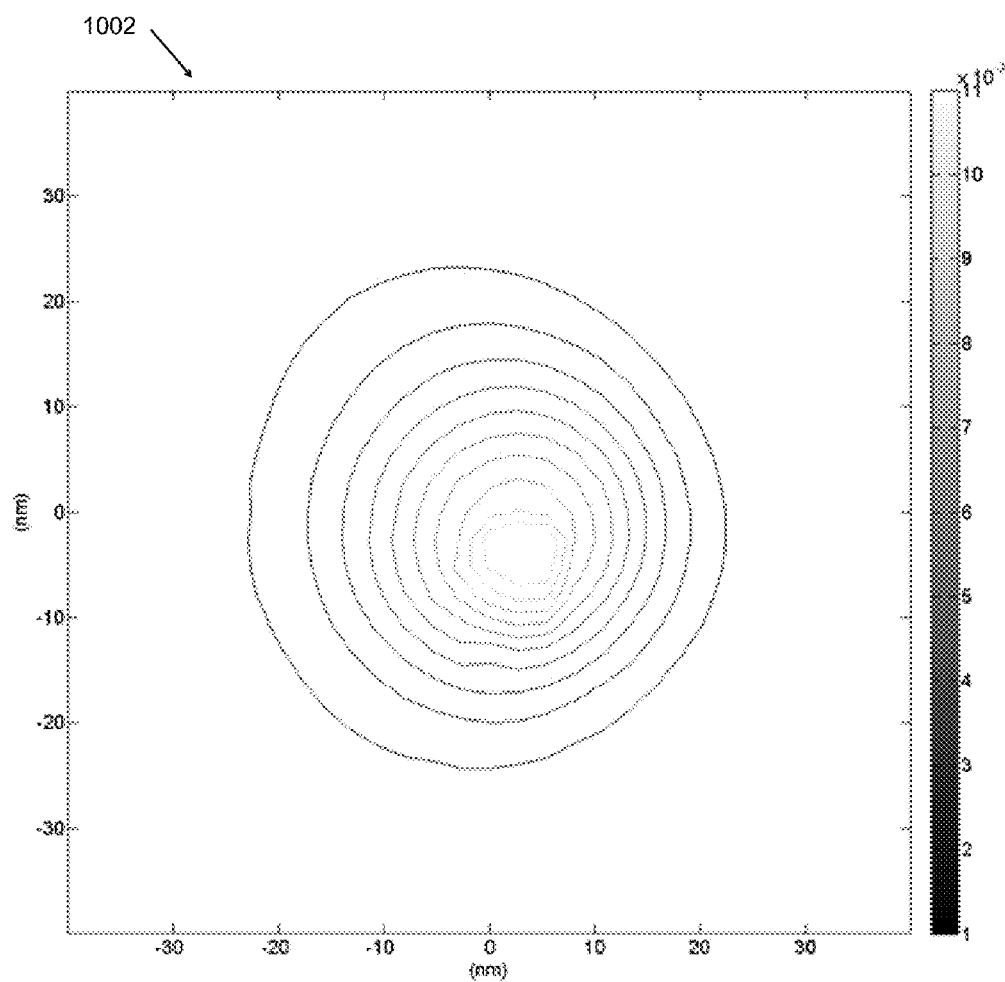
FIG. 10 depicts an example PSF determined based on the reference and observed images of FIGS. 8 and 9 using aspects described herein.
Figure 11:
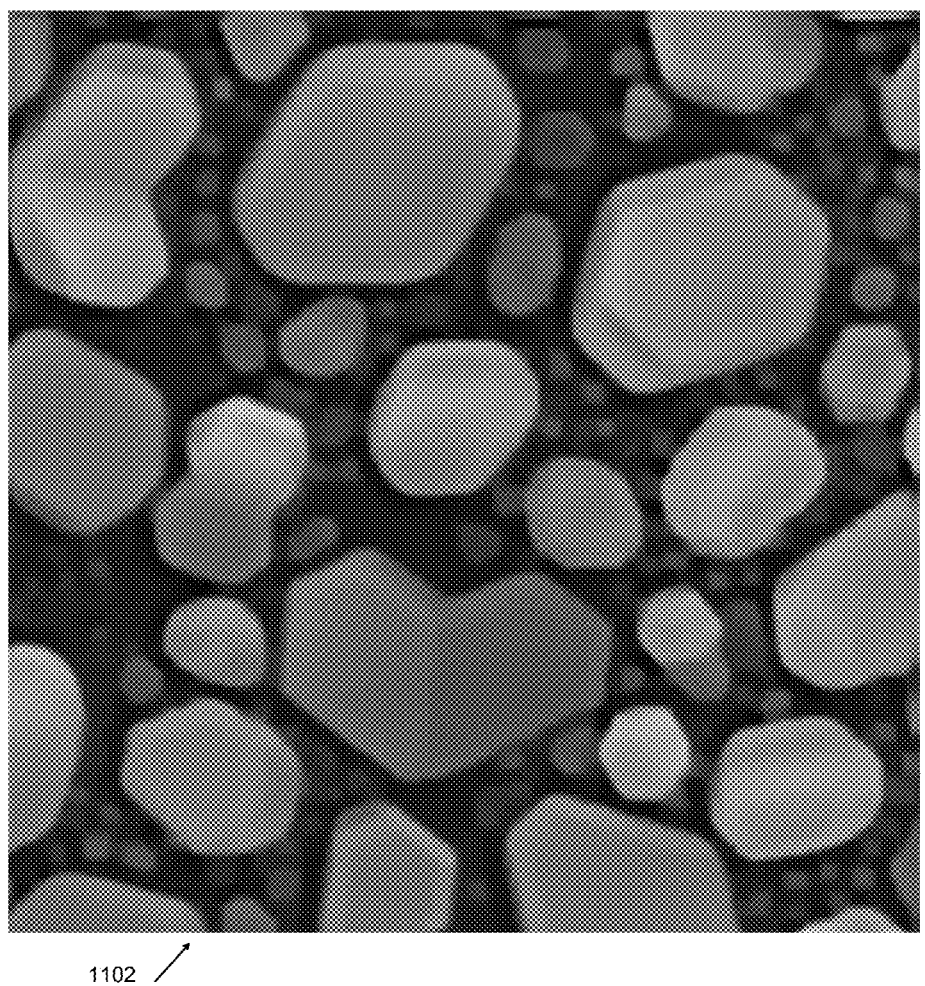
FIG. 11 depicts an example restored version of the observed image of FIG. 9, in accordance with aspects described herein.
Figure 12:
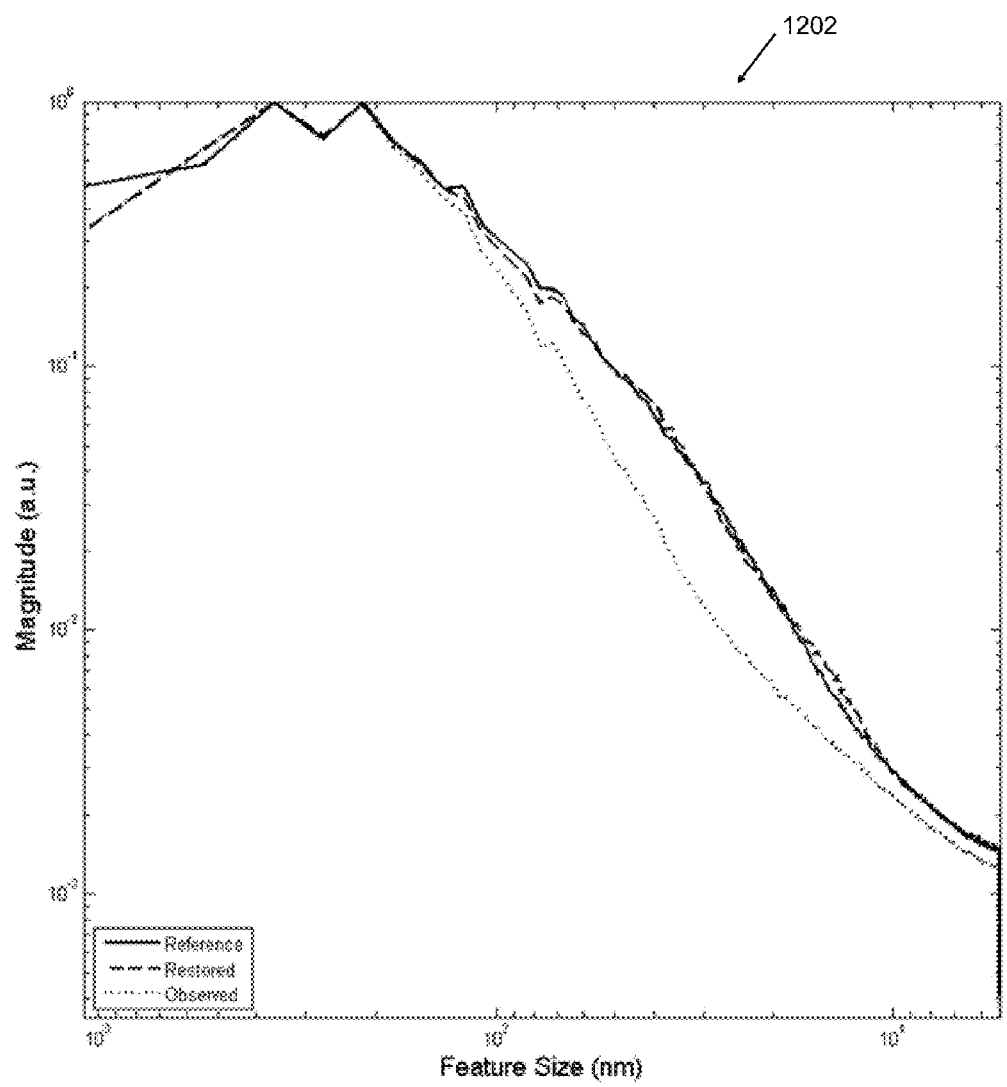
FIG. 12 depicts an example contrast transfer function plot (CTF) that compares the CTF for the reference image of FIG. 8 with the observed image of FIG. 9 and restored version of the observed image of FIG. 11, showing the improvement in resolution, in accordance with aspects described herein.

A result of the deconvolution in the example of FIGS. 8-10 provides a restored image 1102 of FIG. 11, with improved resolution (as compared to the observed image from FIG. 9). The field of view in FIG. 11 is also approximately 1 micrometer. The improvement is verified in FIG. 12, which presents a contrast transfer function plot (CTF) 1202 that compares the CTF for the reference image (pixel level resolution) with the original (blurry, observed image) image and restored version of the observed image, showing the improvement in resolution. Shift of the CTF of the restored image to the right of the blurry (observed) image shows resolution gain. The further the curve is shifted to the right, the better the CTF and therefore the resolution. The reference image, as expected, is generally furthest to the right and the fact that the CTF for the restored image is shifted further to the right than the original (observed) image shows that resolution has been improved.

Figure 13:
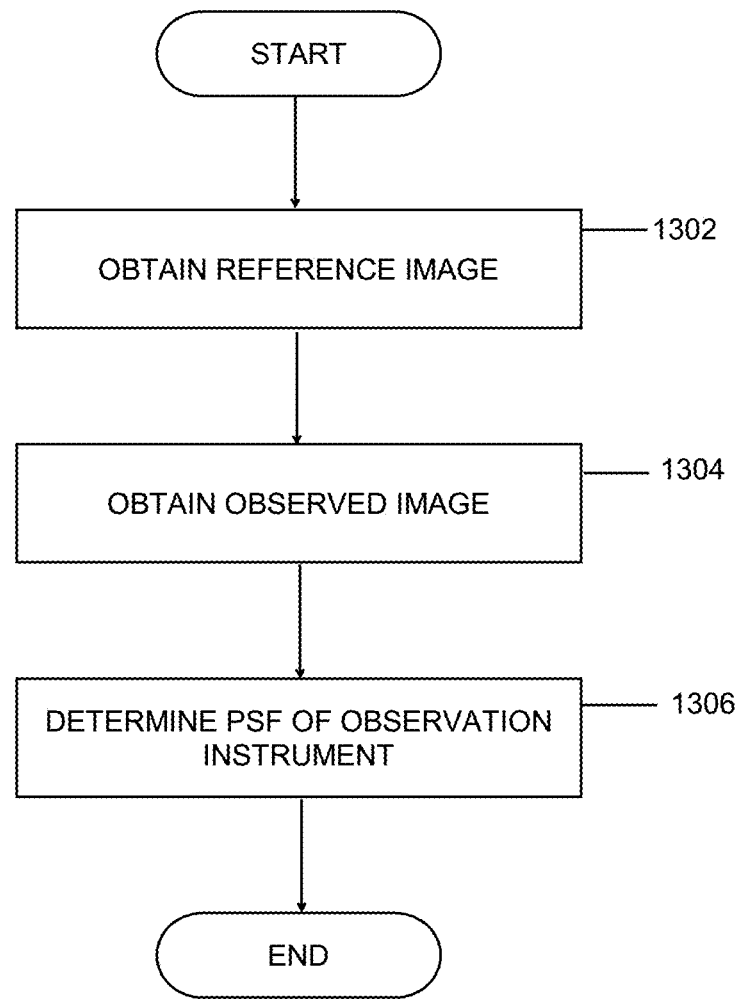
FIG. 13 depicts an example process for ascertaining a point spread function of a probe of an observation instrument in accordance with aspects described herein.

FIG. 13 depicts an example process for ascertaining a point spread function of a probe of an observation instrument in accordance with aspects described herein. In some embodiments, one or more aspects of the process are performed by a computer system, such as one in communication with, associated with, coupled to, and/or incorporated in a microscope or other instrument.

The process begins by obtaining a first image (1302), the first image being a reference image obtained based on a reference instrument, and the reference image being an image of an area of a reference standard. In some embodiments, obtaining the reference image includes actually imaging the area of the reference standard using the reference instrument, while in other embodiments, obtaining the reference image includes calculating the reference image theoretically based on properties of the reference instrument, absent actually measuring the area of the reference standard using the reference instrument.

The reference standard may be initially obtained by selecting or fabricating the standard to provide relatively high contrast for a selected imaging mode and resistance to damage or alteration from imaging the reference standard.

The process continues by obtaining a second image (1304), the second image being an observed image of the area of the reference standard. The observed image may be obtained using the observation instrument configured with a set of operational parameters that define a probe size (i.e. focused scanning particle beam size) for the observation instrument, the probe size being larger than a pixel size of the reference image.

In some examples, the reference instrument and the observation instrument are different instruments (e.g. microscopes), though in other examples the reference instrument and the observation instrument are the same instrument, i.e. the reference and observation images are obtained under different operating conditions. Therefore, a signal type detected to obtain the reference image based on the reference instrument may differs from a signal type detected to obtain the observed image using the observation instrument.

In some examples, the reference image has a pixel size smaller than a probe size or signal excitation size of a probe of the reference instrument. In other examples, the reference image has a pixel size substantially the same as a probe size or signal excitation size of a probe of the reference instrument (for instance they deviate from each other by no more than 20%).

Continuing with the process of FIG. 13, the process then determines, based on the reference image and the observed image, the point spread function (PSF) of the observation instrument as a component of a convolution of the reference image that provides the observed image. In some examples, the determining includes selecting collection times for collecting image data for the reference and observed images. Such selecting may be based on beam dwell time per pixel and probe current, and the data collection times can provide a desired signal-to-noise ratio in the reference image and the observed image, and minimize one or more of sample drift, contamination, and damage to the sample.

The PSF may be a mathematical component of the convolution. In examples described herein, the PSF is represented as a matrix, though in other embodiments, the PSF may be another type of mathematical component, such as a continuous function. The PSF can be expressed in matrix form, and the determining can include transforming the observed image and the PSF in matrix form into a column vector format, and recasting the reference image into a block circulant matrix, to solve for the PSF.

In some embodiments, the determining includes recasting a convolution equation accounting for noise into a functional form that is optimizable subject to constraint terms that reduce errors due to unlikely or physically unrealizable determinations of the PSF.

In some embodiments, the determining includes performing sub-pixel alignment between the reference image and the observed image, the performing the sub-pixel alignment facilitating avoiding errors in the PSF determination.

In some embodiments, the determining includes adjusting brightness and contrast of the reference and observed images to be consistent and facilitate error avoidance in determining the PSF.

The focused scanning particle beam (i.e. the probe of the observation instrument, for which the PSF is being determined) can includes electrons, photons, or ions. In this regard, the observation instrument can include an electron beam lithography tool.

One or more of the reference image and the observed image may be obtained based on measuring one or more signals including secondary electrons, backscattered electrons, transmitted electrons, specimen current, ions, x-rays or cathodoluminescence emission, as examples.

The process of FIG. 13 ends by determining the PSF, though additional and/or subsequent processing using that PSF may be performed. In some examples, the PSF enables improvement in resolution of images taken from the observation instrument under the conditions for which the PSF was ascertained. For example, observed images (taking under those conditions, such that the determined PSF is accurate for the observation instrument) may be deconvoluted using that PSF, which provides accurate image enhancement/restoration beyond the level of detail provided by the observation instrument when obtaining the image.

Those having ordinary skill in the art will recognize that aspects described herein may be embodied in one or more computer systems, one or more methods and/or one or more computer program products. In some embodiments, aspects described herein may be embodied entirely in hardware, entirely in software (for instance in firmware, resident software, micro-code, etc.), or in a combination of software and hardware aspects that may all generally be referred to herein as a "system" and include circuit(s) and/or module(s).

In one example, aspects described herein (such as the processing of FIG. 13) are embodied within a computer system. The computer system may be a system or controller for controlling, directly or indirectly, a microscope. The controller may be a component of the microscope or may be a standalone system in communication with a microscope or component thereof, as examples. The computer system can drive operation of component(s) of the microscope. In some examples, the computer system is a microcontroller provided as part of a microscope system, having a microprocessor that executes commands. In other examples, the computer system is a more robust computer, such as is described below.

The computer system can perform aspects of methods/processes described herein for determining a point spread function, which ultimately may be used, perhaps by the computer system, for, e.g. producing enhanced images, assessing machine performance, benchmarking performance, adjusting for astigmatism, and other functions.

Figure 14:
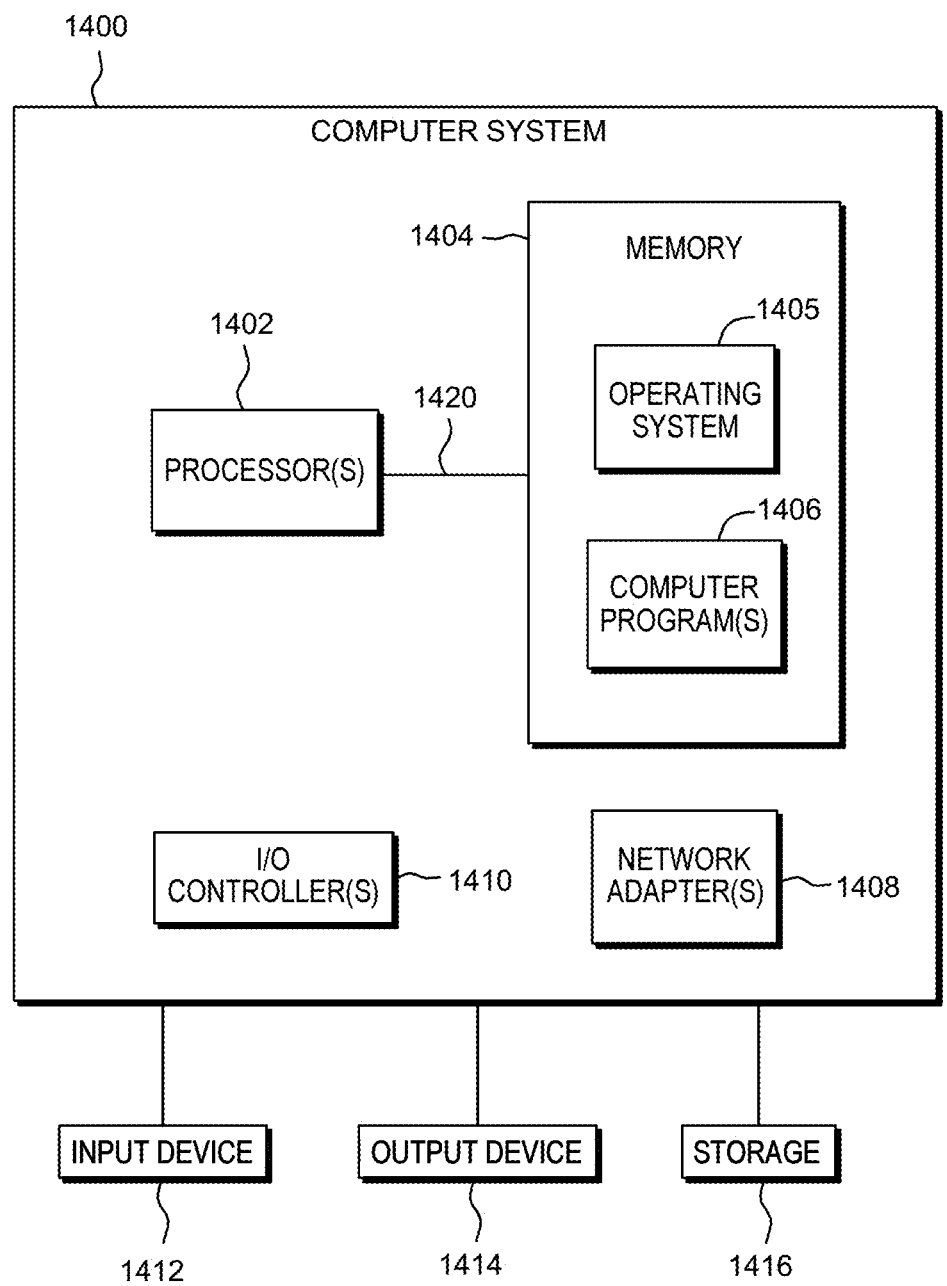
FIG. 14 depicts an example of a computer system to incorporate or use aspects described herein.

FIG. 14 depicts one example of a computer system to incorporate and use aspects described herein. Such a computer system 1400 may be suitable for storing and/or executing program code, such as program code for performing processes described above, and can include at least one processor 1402 coupled directly or indirectly to memory 1404 through a bus. In operation, processor(s) 1402 obtain from memory 1404 one or more instructions for execution by the processors. Memory 1404 may include local memory employed during actual execution of the program code, bulk storage, and cache memories which provide temporary storage of at least some program code in order to reduce the number of times code must be retrieved from bulk storage during program code execution. A non-limiting list of examples of memory 1404 includes a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 1404 includes an operating system 1405 and one or more computer programs 1406, such as one or more programs for execution to perform aspects described herein.

Input/Output (I/O) devices 1412, 1414 (such as peripheral devices) may be coupled to the system 1400 either directly or through I/O controllers 1410.

Network adapters 1408 may also be coupled to the system to enable the computer system to become coupled to other computer systems through intervening private or public networks. Modems, cable modem and Ethernet cards are just a few of the currently available types of network adapters. In one example, network adapters 1408 facilitate obtaining data from remote sources to facilitate aspects described herein.

Computer system 1400 may be coupled to storage 1416 (e.g., a non-volatile storage area, such as magnetic disk drives, optical disk drives, a tape drive, etc.), having one or more databases. Storage 1416 may include an internal storage device or an attached or network accessible storage. Computer programs in storage 1416 may be loaded into memory 1404 and executed by a processor 1402.

The computer system 1400 may include fewer components than described, additional components not described herein, or some combination of the components described and additional components. Computer system 1400 may include any computing device, such as a mainframe, server, cluster, personal computer, workstation, virtual computer, laptop, handheld computer, telephony device, network appliance, virtualization device, storage controller, etc.

In addition, processes described above may be performed by multiple computer systems, working as part of a clustered computing environment.

In some embodiments, aspects described herein may take the form of a computer program product embodied in one or more computer readable medium(s). The one or more computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 15:
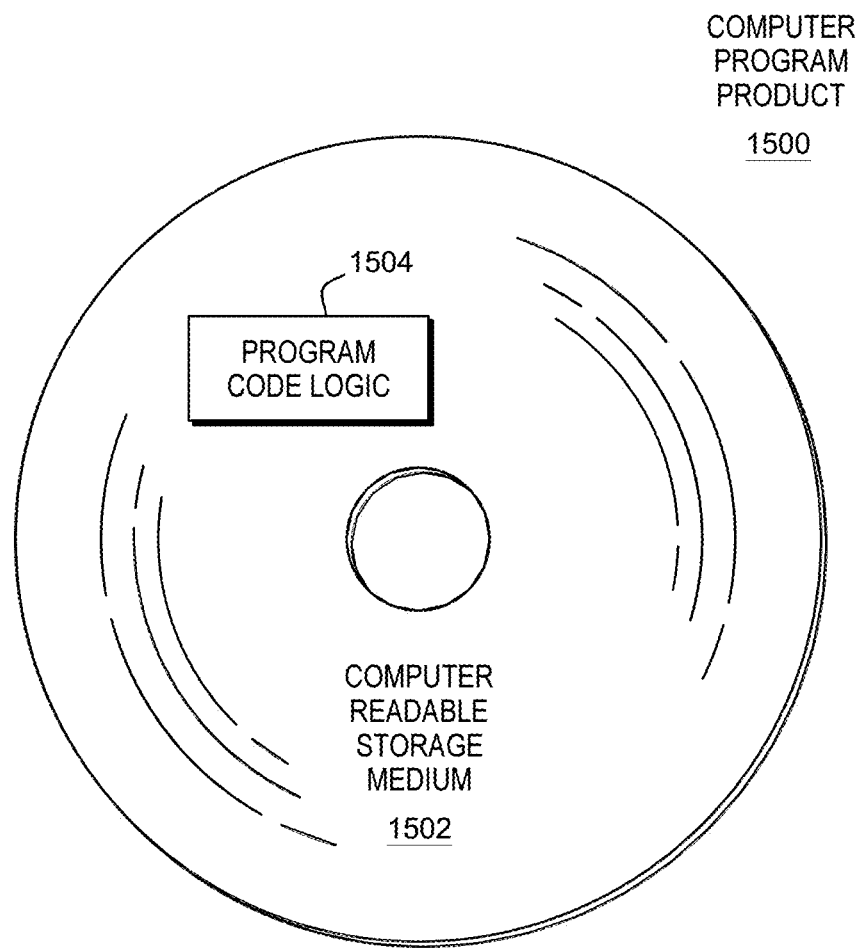
FIG. 15 depicts one embodiment of a computer program product.

Referring to FIG. 15, in one example, a computer program product 1500 includes, for instance, one or more computer readable storage media 1502 to store computer readable program code means, logic and/or instructions 1504 thereon to provide and facilitate one or more embodiments.

Program code contained or stored in/on a computer readable medium can be obtained and executed by a computer system (computer, computer system, etc. including a component thereof) and/or other devices to cause the computer system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects described herein may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN) (such as using the TCP/IP protocol), and/or via an external computer (for example, through the Internet using an Internet Service Provider).

In one example, program code includes one or more program instructions obtained for execution by one or more processors. Computer program instructions may be provided to one or more processors of, e.g., one or more computer system, to produce a machine, such that the program instructions, when executed by the one or more processors, perform, achieve, or facilitate aspects described herein, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects described herein. These flowchart illustrations and/or block diagrams could, therefore, be of methods, apparatuses (systems), and/or computer program products according to aspects described herein.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A method comprising:
    ascertaining a point spread function (PSF), of a focused scanning particle beam, of an observation instrument, the ascertaining the PSF comprising:
        obtaining a first image, the first image being a reference image obtained based on a reference instrument, and the reference image being an image of an area of a reference standard;
        obtaining a second image, the second image being an observed image of the area of the reference standard, and the observed image obtained using the observation instrument configured with a set of operational parameters that define a probe size and associated unknown PSF of the observation instrument, the probe size being larger than a pixel size of the reference image; and
        determining, based on the reference image and the observed image, the PSF of the observation instrument as a component of a convolution of the reference image that provides the observed image.

2. The method of claim 1, wherein obtaining the reference image comprises imaging the area of the reference standard using the reference instrument.

3. The method of claim 1, wherein obtaining the reference image comprises calculating the reference image theoretically based on properties of the reference instrument, absent measuring the area of the reference standard using the reference instrument.

4. The method of claim 1, further comprising obtaining the reference standard by selecting or fabricating the standard to emphasize contrast of features of the reference standard relative to their background for a selected imaging mode and resistance to damage or alteration from imaging the reference standard.

5. The method of claim 1, wherein the determining comprises performing sub-pixel alignment between the reference image and the observed image, the performing the sub-pixel alignment facilitating avoiding errors in the PSF determination.

6. The method of claim 1, wherein the determining comprises adjusting brightness and contrast of the reference and observed images to be consistent and facilitate error avoidance in determining the PSF.

7. The method of claim 1, wherein the PSF as a component of the convolution is a mathematical component of the convolution, comprising a matrix or a continuous function.

8. The method of claim 1, wherein the PSF is expressed in matrix form and wherein the determining comprises transforming the observed image and the PSF in matrix form into a column vector format, and recasting the reference image into a block circulant matrix, to solve for the PSF.

9. The method of claim 1, wherein the determining comprises recasting a convolution equation accounting for noise into a functional form that is optimizable subject to constraint terms that reduce errors due to unlikely or physically unrealizable determinations of the PSF.

10. The method of claim 1, wherein the determining comprises selecting collection times for collecting image data for the reference and observed images, the selecting based on beam dwell time per pixel and probe current, and the data collection times providing a desired signal-to-noise ratio in the reference image and the observed image and minimizing one or more of sample drift, contamination, and damage to the sample.

11. The method of claim 1, wherein the reference image has a pixel size smaller than or substantially the same as a probe size or signal excitation size of a probe of the reference instrument.

12. The method of claim 1, wherein the reference instrument and the observation instrument are different microscopes.

13. The method of claim 12, wherein a signal type detected to obtain the reference image based on the reference instrument differs from a signal type detected to obtain the observed image using the observation instrument.

14. The method of claim 1, wherein the reference instrument and the observation instrument are the same instrument.

15. The method of claim 1, wherein the focused scanning particle beam comprises electrons, photons, or ions.

16. The method of claim 1, wherein the observation instrument comprises an electron beam lithography tool.

17. The method of claim 1, wherein one or more of the reference image and the observed image are obtained based on measuring one or more signals comprising secondary electrons, backscattered electrons, transmitted electrons, specimen current, ions, x-rays or cathodoluminescence emission.

18. A computer system comprising:
   a memory; and
   a processor in communications with the memory, wherein the computer system is configured to perform a method, the method comprising:
      ascertaining a point spread function (PSF), of a focused scanning particle beam, of an observation instrument, the ascertaining the PSF comprising:
         obtaining a first image, the first image being a reference image obtained based on a reference instrument, and the reference image being an image of an area of a reference standard;
         obtaining a second image, the second image being an observed image of the area of the reference standard, and the observed image obtained using the observation instrument configured with a set of operational parameters that define a probe size and associated unknown PSF the observation instrument, the probe size being larger than a pixel size of the reference image; and
         determining, based on the reference image and the observed image, the PSF of the observation instrument as a component of a convolution of the reference image that provides the observed image.

19. A computer program product comprising:
   a non-transitory computer readable storage medium readable by a processor and storing instructions for execution by the processor for performing a method comprising:
      ascertaining a point spread function (PSF), of a focused scanning particle beam, of an observation instrument, the ascertaining the PSF comprising:
         obtaining a first image, the first image being a reference image obtained based on a reference instrument, and the reference image being an image of an area of a reference standard;
         obtaining a second image, the second image being an observed image of the area of the reference standard, and the observed image obtained using the observation instrument configured with a set of operational parameters that define a probe size and associated unknown PSF of the observation instrument, the probe size being larger than a pixel size of the reference image; and
         determining, based on the reference image and the observed image, the PSF of the observation instrument as a component of a convolution of the reference image that provides the observed image.

20. The method of claim 1, wherein the associated unknown PSF takes on an unknown and unassumed functional form.

* * * * *